(12) United States Patent
Trenchs Magana et al.

(10) Patent No.: US 7,924,019 B2
(45) Date of Patent: Apr. 12, 2011

(54) SYSTEM AND METHOD FOR FAULT ISOLATION AND LEAKAGE CURRENT DETECTION

(75) Inventors: Albert Trenchs Magana, Reus (ES); Yann Darroman, Vilabella (ES)

(73) Assignee: Lear Corporation, Southfield, MI (US)

( * ) Notice: Subject to any disclaimer, the term of this patent is extended or adjusted under 35 U.S.C. 154(b) by 296 days.

(21) Appl. No.: 12/342,110

(22) Filed: Dec. 23, 2008

(65) Prior Publication Data

US 2009/0179655 A1    Jul. 16, 2009

Related U.S. Application Data

(60) Provisional application No. 61/021,472, filed on Jan. 16, 2008.

(51) Int. Cl.
*G01R 31/00* (2006.01)
*G01R 31/08* (2006.01)
*G01M 17/00* (2006.01)

(52) U.S. Cl. ............................ 324/503; 324/522; 701/29

(58) Field of Classification Search .................. 324/503, 324/500, 522, 555, 509, 510, 537, 772; 702/1, 702/57, 58, 185, 183, 182, 127, 117, 108; 701/22, 29

See application file for complete search history.

(56) References Cited

U.S. PATENT DOCUMENTS

| | | | | |
|---|---|---|---|---|
| 5,686,839 A | * | 11/1997 | Takagi | 324/503 |
| 6,788,504 B2 | * | 9/2004 | Vanderkolk | 361/42 |
| 7,558,655 B2 | * | 7/2009 | Garg et al. | 701/29 |

* cited by examiner

*Primary Examiner* — Hoai-An D Nguyen
(74) *Attorney, Agent, or Firm* — Brooks Kushman P.C.

(57) ABSTRACT

An inverter system for a vehicle including a housing, a primary stage, a secondary stage and a fault detection circuit is provided. The primary stage is configured to receive a first voltage signal from an energy power source to generate a second voltage signal. The secondary stage is configured to generate a third voltage signal in response to the second voltage signal. At least one of the primary and the secondary stages define at least one resistance point for discharging leakage current responsive to generating the third voltage signal. The fault detection circuit is configured to electrically couple the primary stage and the secondary stage to provide the second voltage signal to the secondary stage and to measure a portion of the third voltage signal to determine whether the leakage current being discharged through the at least one resistance point is within a predetermined current range.

20 Claims, 2 Drawing Sheets

SYSTEM AND METHOD FOR FAULT ISOLATION AND LEAKAGE CURRENT DETECTION

CROSS-REFERENCE TO RELATED APPLICATIONS

This application claims the benefit of U.S. provisional application Ser. No. 61/021,472 filed Jan. 16, 2008 which is hereby incorporated by reference in its entirety.

BACKGROUND

1. Technical Field

One or more embodiments of the present invention generally relate to a system and method for detecting a fault isolation and leakage current for an inverter circuit in a vehicle.

2. Background Art

It is known that in order to charge or use electrical devices that are not part of the vehicle (such as, but not limited to, cell phones, laptops, or vacuum cleaners) various aftermarket adapters are needed to be purchased so that such adapters can be plugged into a power outlet of the vehicle and into the electrical device to charge or use the electrical device. To charge and/or use such an electrical device in a vehicle, an aftermarket vehicle adapter is needed that includes a cable and a connector generally shaped in the form of a cylindrical connector to mate with a power outlet (e.g., cigar lighting receptacle) in the vehicle. The connector includes a retractable conductive pin that makes contact with a mating terminal positioned within the power outlet of the vehicle to enable power transmission therebetween. The adapter may include additional circuitry (e.g., inverter circuit) for converting the DC power to AC power so that the electrical device can operate or store power provided by the vehicle.

Original equipment manufacturers (OEMS) are attempting to obviate the need for vehicle occupants to have to purchase the aftermarket vehicle electrical adapter as described above. For example, OEMs are implementing a female prong connector within the vehicle that is capable of receiving a male prong connector in a similar manner to that invoked when connecting an electrical device to an electrical wall outlet of a home, a building, or other suitable establishment. OEMs are consistently on guard for the need to provide a safe connection for users that may come into contact with the female prong connector or other componentry that is utilized to provide for DC to AC conversion in the vehicle.

SUMMARY

An inverter system for a vehicle comprising a housing, a primary stage, a secondary stage and a fault detection circuit is provided. The primary stage is configured to receive a first voltage signal from an energy power source to generate a second voltage signal. The secondary stage is configured to generate a third voltage signal in response to the second voltage signal. At least one of the primary and the secondary stages define at least one resistance point for discharging leakage current responsive to generating the third voltage signal. The fault detection circuit is configured to electrically couple the primary stage and the secondary stage to provide the second voltage signal to the secondary stage and to measure a portion of the third voltage signal to determine whether the leakage current being discharged through the at least one resistance point is within a predetermined current range.

BRIEF DESCRIPTION OF THE DRAWINGS

The embodiments of the present invention are pointed out with particularity in the appended claims. However, other features of the various embodiments will become more apparent and will be best understood by referring to the following detailed description in conjunction with the accompany drawings in which:

DETAILED DESCRIPTION

Detailed embodiments of the present invention are disclosed herein. However, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the one or more embodiments of the present invention.

In order to provide for DC to AC conversion in a vehicle so that an electrical device can operate from the high AC based voltage output, various safety measures can be employed to protect users that come into contact with a prong in a connector that is associated with providing the high AC based voltage to the electrical device. In a first measure, any components generally associated with the high AC based voltage (including the connector and the one or more of the prongs) are adequately isolated from the rest of the electrical network of the vehicle (e.g., ground connection to earth via a chassis connection through tires of the vehicle). Such isolation is adequate so long as various isolation resistance points about the DC to AC conversion system (or inverter system) are high.

A second measure requires that in the event a failure exists with respect to isolating the high AC voltage component from the rest of the vehicle network, such a high AC voltage is disconnected to prevent the risk of shocking the user. One or more embodiments of the present invention are directed toward protecting a user that may come into contact with the prong of the connector that is utilized to transfer the high AC voltage from the vehicle to the electrical device.

Figure 1:
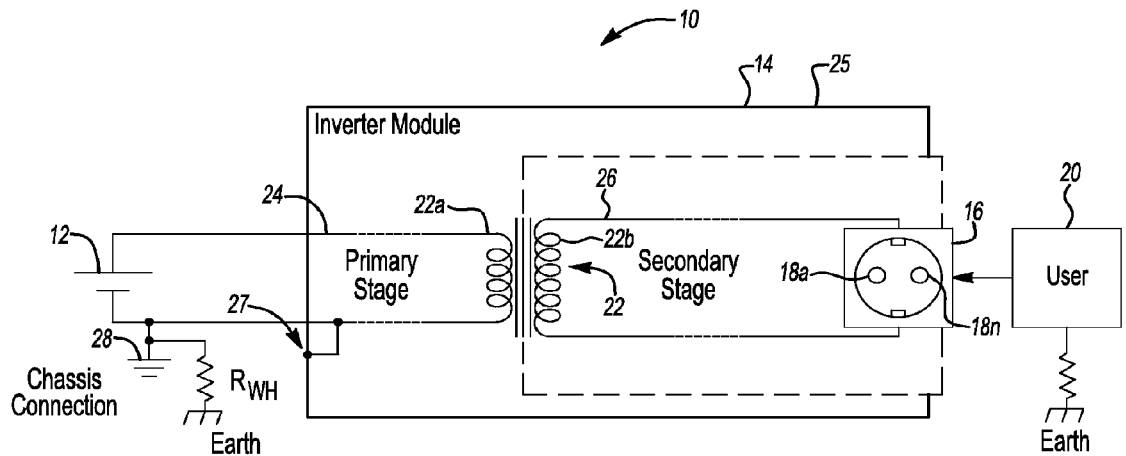
FIG. 1 depicts an inverter system for use in a vehicle.

FIG. 1 generally illustrates an inverter system 10 for use in a vehicle. The system 10 comprises an energy source 12 and an inverter module 14. The inverter module 14 generally includes a first connector 16 having prongs 18a-18n therein for receiving a second connector (not shown). A user 20 may mate the second connector to the first connector 16. In general, the inverter module 14 is configured to receive a DC voltage from the energy source 12 and to convert the DC voltage into an AC voltage output. The second connector is coupled to an electrical device. The electrical device may comprise a cell phone, laptop computer, vacuum cleaner, or other suitable device that requires A/C electrical power to operate.

The AC voltage output may be any one of, but not limited to, 100 Vac/50 Hz, 110 Vac/60 Hz, 200 Vac/60 Hz, 220 Vac/60 Hz, or 230 Vac/50 Hz depending on the country in which the vehicle will be used. In one example, the energy source 12 may be a vehicle battery that generates 12 Vdc. In another example, the energy source 12 may be a DC supply such as a voltage DC/DC stabilizer or converter that converts a high DC-based voltage to a DC voltage level suitable for input to the inverter module 14. The energy source 12 is recognized to be any such device capable of providing a suitable input to the inverter module 14.

The inverter module 14 includes a primary stage 24 and a secondary stage 26. The inverter module 14 further includes a transformer 22 having a primary coil 22a and a secondary coil 22b. The primary stage 24 and the secondary stage 26 coact with each other to convert the DC voltage input into the AC voltage output. For example, the primary stage 24 may include a DC/AC converter (not shown) to convert the DC input voltage into a low AC voltage having a high frequency component. The secondary stage 26 converts the low AC voltage back into a high DC voltage (e.g., 300 V or other suitable voltage). The high DC voltage is input to a switching element that includes MOSFET(s), IGBT(s) or other suitable power devices to generate the desired AC voltage output. The above description of converting the DC voltage into the AC voltage output is known in the art and will not be described further. The secondary stage 26 is generally isolated (via various isolation elements) from the primary stage 24 due to the high voltage characteristics of the secondary stage 26. The isolation elements include, but not limited to, separation mechanisms in printed circuit board (PCB) to separate tracks in primary and secondary stages 24, 26, galvanic isolation in the transformer 22, optocouplers, or other suitable devices. The primary stage 24 may include the primary coil 22a of the transformer 22 and the secondary stage 26 may include the secondary coil 22b of the transformer 22.

The inverter module 14 includes a housing 25 that is constructed of metal (other electrically conductive materials are contemplated). The primary stage 24 and the secondary stage 26 are generally positioned within the inverter module 14. The first connector 16 may be positioned in a center stack area of an instrument panel in the vehicle. An insulated wiring cable may be coupled to the first connector 16 and the inverter module 14 to enable electrical communication therebetween.

The housing 25 may be situated so that contact is made with a surface in the vehicle that is sufficient to establish a suitable ground to earth. In one example, the housing 25 may be coupled to a vehicle chassis (e.g., see chassis connection 28). The chassis connection 28 is coupled to earth via wheels (not shown). The wheels may include a small resistance as represented by $R_{wh}$.

A connection 27 is made between the housing 25 and a negative feed of the energy source 12. As noted above, the secondary stage 26 is isolated from the primary stage 24. Such isolation generally refers to the condition whereby minimal leakage current flows between the primary stage 24 and the secondary stage 26 while the inverter module 14 converts the DC voltage input into the AC voltage output. By isolating the secondary stage 26 from the primary stage 24, such a condition also isolates the secondary stage 26 from the connection 27 of the negative feed, and the chassis connection 28. If the secondary stage 26 is not properly isolated from the primary stage 24, then a large amount of leakage current may flow between the primary stage 24 and the secondary stage 26 if the circuit is closed. Such a condition may harm the user 20 in the event the user 20 contacts the negative prong of the first connector 16.

Figure 2:
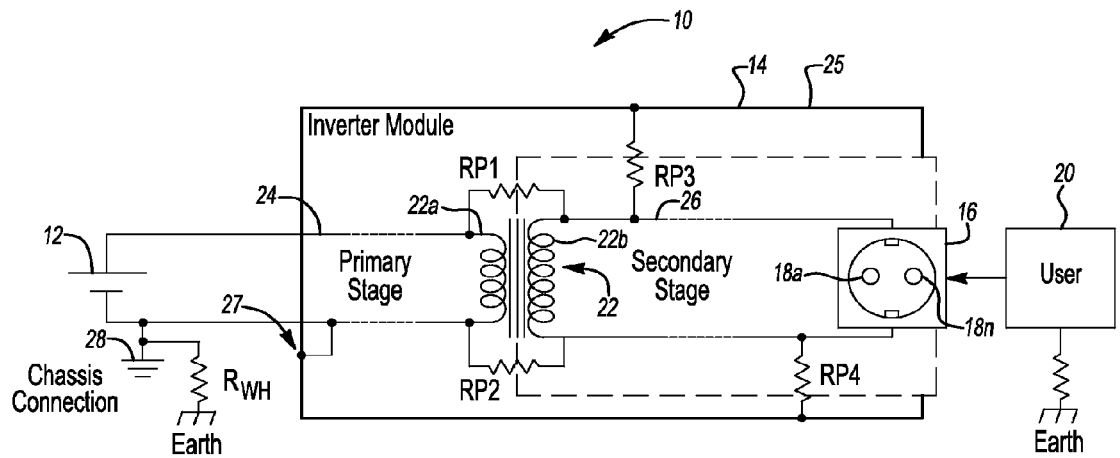
FIG. 2 depicts various internal resistance points of the inverter system.

FIG. 2 depicts various internal resistance points (RP1, RP2, RP3, and RP4) that may be present within the inverter system 10. The ohmic values of the various internal resistance points RP1, RP2, RP3 and RP4 determine the amount of leakage current that flows between the primary stage 24 and the secondary stage 26. It is to be noted that internal resistance points RP1-RP4 are not to be construed as actual resistors that are implemented within the inverter module 14 for the purpose of converting the DC voltage input into the AC voltage output. Such internal resistance points RP1-RP4 represent locations that may exhibit ohmic values between the primary stage 24, the secondary stage 26, and/or the housing 25.

The resistance values of the internal resistance points RP1-RP4 under normal operating conditions are high which indicates that the secondary stage 26 is isolated from the primary stage 24. RP1 may correspond to an internal resistance between the positive side of the primary coil 22a and the positive side of the secondary coil 22b of the transformer 22. RP2 may correspond to an internal resistance between a negative side of the primary coil 22a and a negative side of the secondary coil 22b. RP3 may correspond to an internal resistance between the positive side of the secondary coil RP3 and the ground (e.g., the metallic housing 25 that is coupled to the chassis connection 28). RP4 may correspond to an internal resistance between the negative side of the secondary coil RP4 and the ground (e.g., the metallic housing 25 that is coupled to the chassis connection 28).

In the event one or more of the resistance points RP1-RP4 exhibit a low ohmic condition, such a condition may correspond to the secondary stage 26 not being isolated from the primary stage 24. In such a case, an isolation fault is considered to exist and the leakage current that is passed from the secondary stage 26 to the primary stage 24 is high in the event the first connector 16 is mated with the second connector. Such an isolation fault may be caused due to one or more issues within the electronics in the primary or secondary stage 26. A low ohmic condition exhibited by any one of the resistance points may correspond to an isolation fault. It is generally recognized that leakage current is passed from the secondary stage 26 to the primary stage 24 (and through the resistance points RP1-RP4) while the high AC voltage output is delivered to the electrical device. When an isolation fault is not present, any such leakage current discharged through the resistance points RP1-RP4 is considered to be negligible.

Figure 3:
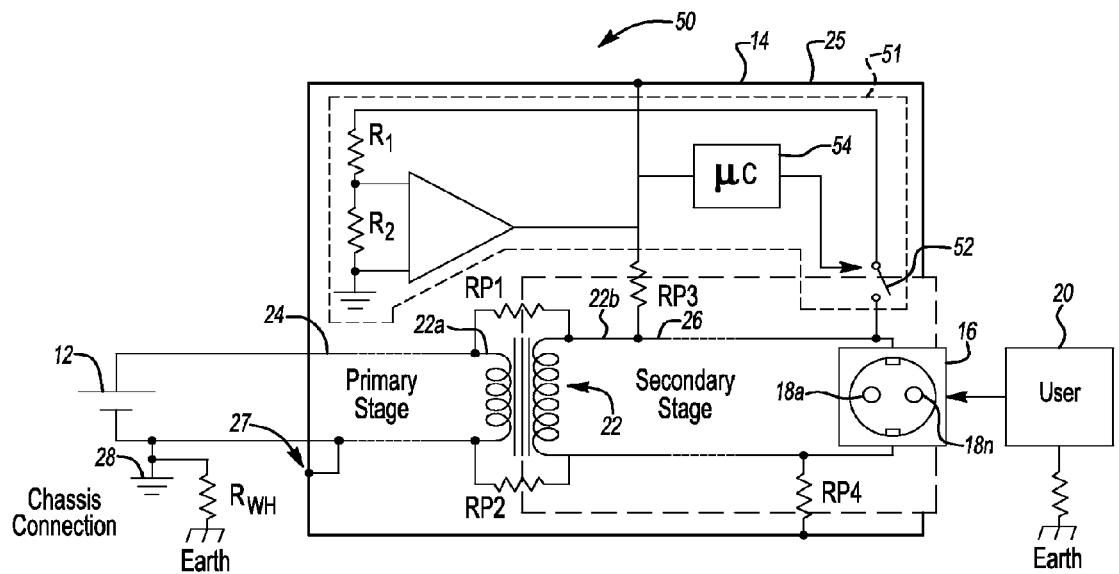
FIG. 3 depicts an inverter system in accordance to one embodiment of the present invention.

FIG. 3 depicts an inverter system 50 in accordance to one embodiment of the present invention. The system 50 includes a fault detection circuit 51. The fault detection circuit 51 is generally configured to determine the amount of leakage current that flows between the secondary stage 26 and the primary stage 24. The fault detection circuit 51 closes the circuit between the primary stage 24 and the secondary stage 26 to determine whether the leakage current is within a predetermined current range. In one example, the predetermined current range may correspond to a current value that is less than 5 mA. The particular current value(s) used to establish the predetermined current range may vary based on the desired criteria of a particular implementation. The fault detection circuit 51 includes a switching device 52, a microcontroller 54, and a voltage divider network (e.g., resistor R1 and R2). The microcontroller 54 measures the voltage across the resistor R1 and/or R2 to determine the amount of leakage current that flows from the secondary stage 26 to the primary stage 24.

In operation, the microcontroller 54 is configured to control the switching device 52 (e.g., switch, relay, transistor, or other suitable mechanism) to close for a predetermined amount of time so that the microcontroller 54 measures the voltage across resistor R2 (or resistor R1 or both resistor R1 and R2) to determine if the measured voltage is within a predetermined voltage range. If the measured voltage across resistor R2 is within the predetermined voltage range, the microcontroller 54 determines that the there are no isolation faults present at one or more of resistance points RP1-RP4. As such, any such leakage current flowing through the inverter module 14 is generally considered to be negligible (or within the predetermined current range) and may not shock the user 20. If the measured voltage is not within the predetermined voltage range, then the microcontroller 54 determines that there is at least one isolation fault present and that the leakage current exceeds the predetermined current range. In this case, the microcontroller 54 may shut the inverter module 14 down and cease to convert the DC voltage input into the AC voltage output to remove the potential for the high leakage current to come into contact with the user 20.

The microcontroller 54 may control an LED or other suitable mechanism to warn the user in response to detecting an isolation fault. In one example, the microcontroller 54 may be electrically coupled to other controllers about the vehicle via a data communication bus. Such a data communication bus may be implemented as, but not limited to, control area network (CAN), local interconnect network (LIN) or other recognized alternate. The microcontroller 54 may transmit a message over the bus to the other controllers so that the controller notifies the user of the isolation fault (e.g., cluster lighting telltale to warn the user).

The microcontroller 54 may control the switching device 52 to close and measure the voltage across the resistor R2 after vehicle engine start-up thereby detecting the presence of a high leakage current condition (or isolation fault) (e.g., one or more of the ohmic values of the resistance points RP1-RP4 is low). The microcontroller 54 shuts the inverter module 14 down in response to detecting the isolation fault before the user may experience a shock condition. It is generally contemplated that the microcontroller 54 may also control the switching device 52 to close and measure the voltage periodically at predefined intervals (e.g., every 10 seconds or suitable time frame) after engine startup.

In one example, the microcontroller 54 may calculate Vrms across the resistor R2 with the measured voltage across the resistor R2. Vrms may correspond to an AC signal having a 5 V peak-to-peak with a DC offset of 2.5V. The microcontroller 54 may measure the voltage across the resistor R2 for a period of 20 ms for an A/C output voltage at 50 Hz and a period of 16.6 ms for an A/C output voltage at 60 Hz. After the microcontroller 54 determines the Vrms for the measured voltage, the microcontroller 54 compares the Vrms against the predetermined voltage range. The voltage values in the predetermined voltage range may be in a root mean square format. It is recognized that the time period used by the microcontroller 54 to measure the voltage may include other values than those noted above.

In one example, the predetermined voltage range may correspond to a range of 0.78 Vrms and 1 Vrms. Meaning, that in the event Vrms for the measured voltage corresponds to a value between 0.78 Vrms and 1 Vrms, such a condition may indicate that there are no isolation faults present and that the leakage current is within the predetermined current range. Such a condition may also indicate that the total resistance of all of the resistance points RP1-RP4 about the inverter module 14 is greater than or equal to 120 Kohms. If, on the other hand, the Vrms for the measured voltage is either less than 0.78 Vrms or greater than 1 Vrms, such a condition may indicate that there is an isolation fault present between the secondary stage 26 and the primary stage 24 and that the leakage current may be outside of the predetermined current range. The microcontroller 54 may shut down the operation of the inverter module 14 in the event such a condition was present. The particular values selected to establish the predetermined voltage range may vary based on the desired criteria of a given implementation.

The number of resistors which form the voltage divider network in the system 50 may vary and are not intended to be limited to those shown in FIG. 3. The voltage divider network (e.g., resistor R1 and R2) may reduce voltage so that an analog/digital (A/D) converter (not shown) within the microcontroller 54 can read the measured voltage across the resistor R1 and/or R2. It is contemplated that the microcontroller 54 may not include the A/D converter to read the voltage across the resistors R1 and R2 and that other suitable methods for reading the voltage may be employed.

As noted above, the secondary stage 26 receives the low DC voltage from the primary stage 24. The secondary stage 26 converts the low AC voltage back into a high DC voltage and presents the high DC voltage to power switching element(s) to generate the desired AC voltage output. In another embodiment, the switching device 52 may be coupled to the various DC stages within the secondary stage 26 so that DC-based voltages may be measured across the resistor R1 and/or R2 to obtain a DC-based measurement as opposed to the to the root-mean square voltage format as described above. With respect to the root-mean square voltage format as described above, the resistors R1 and R2 are generally coupled to various devices within the secondary stage 26 that are associated with the AC voltage component.

Figure 4:
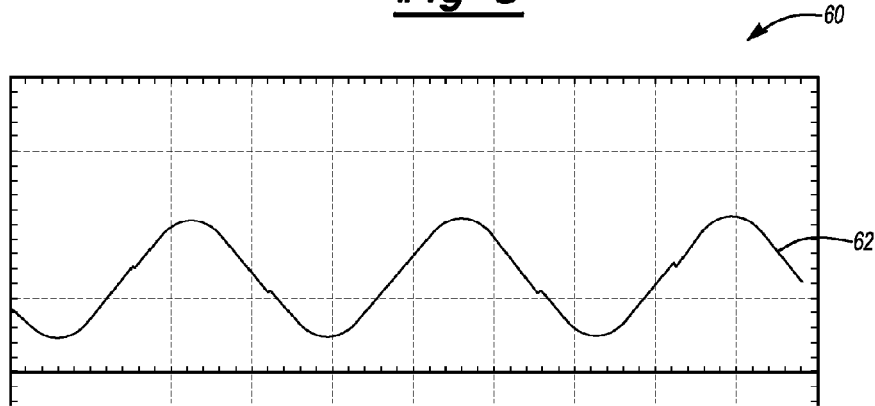
FIG. 4 is a plot depicting a waveform which corresponds to non-isolation fault condition.

FIG. 4 is a plot 60 depicting a measured waveform 62 which corresponds to non-isolation fault condition in accordance to one example of the present invention. Waveform 62 generally corresponds to the measured voltage across a single resistor (e.g., resistors R1 or R2). The waveform 62 is shaped in the form of a sinusoidal wave and that such a sinusoidal wave generally indicates that the various internal resistance points RP1-RP4 exhibit a high resistance value (e.g., a measured voltage reading that is within the predetermined voltage range) thereby indicating that the leakage current is within the predetermined current range (e.g., less than 5 mn or other suitable current value).

Figure 5:
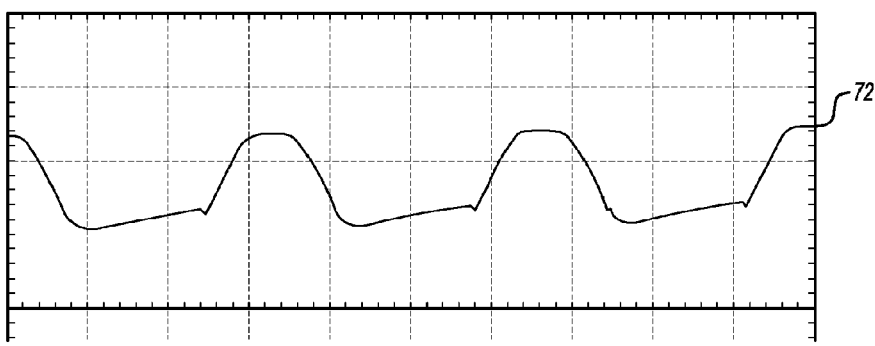
FIG. 5 is a plot depicting a waveform which corresponds to one isolation fault condition.

FIG. 5 is a plot 70 depicting a measured waveform 72 which corresponds to an isolation fault condition. Waveform 72 is an example of the measured voltage that may be an indicative of a risk of high leakage current (e.g., measured voltage not within predetermined voltage range). In such case, one or more of the internal resistor points RP1-RP4 may exhibit a low resistance state. It is generally contemplated that other such electronics such as capacitor(s), diode(s) and/or inductor(s) included within the inverter module 14 may be combined with the resistors R1 and/or R2 to provide an alternate detection circuit to create a signature waveform that corresponds to a high leakage current condition.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. An inverter system for a vehicle comprising:
    a housing;
    a primary stage positioned within the housing and being configured to receive a first voltage signal from an energy power source to generate a second voltage signal;
    a secondary stage positioned within the housing and configured to generate a third voltage signal in response to the second voltage signal, wherein at least one of the primary and the secondary stages defines at least one resistance point for discharging leakage current responsive to generating the third voltage signal; and a fault detection circuit configured to electrically couple the primary stage and the secondary stage to provide the second voltage signal to the secondary stage and to measure a portion of the third voltage signal to determine whether the leakage current being discharged through the at least one resistance point is within a predetermined current range.

2. The inverter system of claim 1 wherein the fault detection circuit includes a switching device and at least one resistor, and wherein the switching device is configured to electrically couple the primary stage to the secondary stage to present the third voltage signal to the at least one resistor to generate the portion of the third voltage signal.

3. The inverter system of claim 2 wherein the fault detection circuit includes a controller configured to measure the portion of the third voltage signal across the at least one resistor and to determine whether the measured portion of the third voltage signal is within a predetermined voltage range.

4. The inverter system of claim 3 wherein the controller is further configured to determine that the leakage current is within a predetermined current range in the event the measured portion of the third voltage signal is within the predetermined voltage range.

5. The inverter system of claim 3 wherein the controller is further configured to determine that the leakage current is not within the predetermined current range if the measured portion of the third voltage signal is not within the predetermined voltage range.

6. The inverter system of claim 5 wherein the controller is further configured to disable the operation of generating the third voltage signal in response to determining that the measured portion of the third voltage signal is not within the predetermined voltage range.

7. The inverter system of claim 1 wherein the housing is metal.

8. The inverter system of claim 1 wherein the first voltage signal is a first DC based voltage signal and the third signal is at least one of a second DC based voltage signal and an AC based voltage output signal.

9. An inverter system for a vehicle comprising:
an electrically conductive housing;
a primary stage positioned within the housing and being configured to receive a first voltage signal from an energy power source to generate a second voltage signal;
a secondary stage positioned within the housing and configured to generate a third voltage signal in response to the second voltage signal, wherein at least one of the primary and the secondary stages defines at least one resistance point for discharging leakage current responsive to generating the third voltage signal; and
a fault detection circuit configured to electrically couple the primary stage and the secondary stage to provide the second voltage signal to the secondary stage and to measure a portion of the third voltage signal to determine whether the leakage current being discharged through the at least one resistance point is within a predetermined current range.

10. The inverter system of claim 9 wherein the fault detection circuit comprises a switching device and a least one resistor, wherein the switching device is configured to electrically couple the primary stage and the second stage to present the third voltage signal to the at least one resistor to generate the portion of the third voltage signal.

11. The inverter system of claim 10 wherein the fault detection circuit further comprises a controller configured to control the switching device to present the third voltage signal to the at least one resistor in response to detecting an engine 'ON' condition.

12. The inverter system of claim 11 wherein the controller is further configured to measure the portion of the third voltage signal across the at least one resistor and to determine whether the measured portion of the third voltage signal is within a predetermined voltage range.

13. The inverter system of claim 12 wherein the controller is further configured to enable the generation of the third voltage signal in response to determining that the measured portion of the third voltage signal is within the predetermined voltage range.

14. The inverter system of claim 12 wherein the controller is further configured to disable the operation of generating the third voltage signal in response to determining that the measured portion of third voltage signal is not within the predetermined voltage range.

15. The inverter system of claim 9 wherein the housing is metal.

16. The inverter system of claim 9 wherein the first voltage signal is a first DC based voltage signal and the third voltage signal is at least one of a second DC based voltage signal and an AC based voltage output signal.

17. An inverter system for a vehicle comprising:
a housing;
a primary stage positioned within the housing and being configured to receive a DC voltage signal from an energy power source to generate a low AC voltage signal;
a secondary stage positioned within the housing and configured to generate a high AC voltage signal in response to the low AC voltage signal, wherein at least one of the primary and the secondary stages defines at least one resistance point for discharging leakage current responsive to generating the high AC voltage signal; and
a fault detection circuit configured to electrically couple the primary stage and the secondary stage to provide the low AC voltage signal to the secondary stage to measure a portion of the high AC voltage signal to determine whether the leakage current being discharged through the at least one resistance point is within a predetermined current range.

18. The inverter system of claim 17 wherein the fault detection circuit includes a switching device and at least one resistor, wherein the switching device is configured to electrically couple the primary stage to the secondary stage to present the high AC voltage signal to the at least one resistor to generate the portion of the high AC voltage signal.

19. The inverter system of claim 18 wherein the fault detection circuit includes a controller configured to measure the portion of the high AC voltage signal across the at least one resistor and to determine whether the measured portion of the high AC voltage signal is within a predetermined voltage range.

20. The inverter system of claim 19 wherein the controller is further configured to disable the operation of generating the high AC voltage signal in response to determining that the measured portion of the high AC voltage signal is not within the predetermined voltage range.

* * * * *